(12) United States Patent
Kwon (10) Patent No.: US 12,542,543 B2
(45) Date of Patent: Feb. 3, 2026

(54) SIGNAL TRANSMISSION CIRCUITS PERFORMING HIGH-SPEED OPERATION

(71) Applicant: SK hynix Inc., Icheon-si (KR)

(72) Inventor: Dae Han Kwon, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 21 days.

(21) Appl. No.: 18/639,319

(22) Filed: Apr. 18, 2024

(65) Prior Publication Data

US 2025/0175163 A1    May 29, 2025

(30) Foreign Application Priority Data

Nov. 28, 2023  (KR) .................. 10-2023-0167542

(51) Int. Cl.
*H03K 3/02* (2006.01)
*H03K 3/037* (2006.01)
*H03K 5/135* (2006.01)

(52) U.S. Cl.
CPC ............. *H03K 3/037* (2013.01); *H03K 5/135* (2013.01)

(58) Field of Classification Search
CPC ........ H03K 3/02; H03K 3/023; H03K 3/0233; H03K 3/027; H03K 3/037; H03K 3/353; H03K 3/356; H03K 3/356034; H03K 3/356043; H03K 3/356086; H03K 3/356095; H03K 3/356104; H03K 3/356182; H03K 3/356191; H05K 5/13; H05K 5/135; H05K 5/22; H05K 5/24; H05K 5/2472; H05K 5/2481; H05K 5/249

See application file for complete search history.

(56) References Cited

U.S. PATENT DOCUMENTS

| 9,270,275 B2 * | 2/2016 | Song ............... H03K 3/356191 |
| 11,025,237 B1 | 6/2021 | Narawade et al. |
| 2019/0058464 A1 * | 2/2019 | Choi ................. H03K 21/10 |

FOREIGN PATENT DOCUMENTS

KR    1020160091685 A    8/2016

* cited by examiner

*Primary Examiner* — Long Nguyen (74) *Attorney, Agent, or Firm* — WILLIAM PARK AND ASSOCIATES LTD.

(57) ABSTRACT

A signal transmission circuit includes a first latch driving circuit configured to latch a first alignment signal, based on a first division clock signal and a second division clock signal, and to drive a transmission signal, and a second latch driving circuit configured to latch a second alignment signal, based on the second division clock signal and a first inverted division clock signal, and to drive the transmission signal.

15 Claims, 10 Drawing Sheets

SIGNAL TRANSMISSION CIRCUITS PERFORMING HIGH-SPEED OPERATION

CROSS-REFERENCE TO RELATED APPLICATIONS

The present application claims priority under 35 U.S.C. § 119(a) to Korean Patent Application No. 10-2023-0167542, filed on Nov. 28, 2023, in the Korean Intellectual Property Office, which application is incorporated herein by reference in its entirety.

BACKGROUND

1. Technical Field

Some embodiments of the present disclosure relate to signal transmission circuits performing high-speed operations.

2. Related Art

Recently, electronic devices advantageously include low-power characteristics and high-speed operation characteristics. For the low-power characteristics, the electronic devices perform internal operations at a low operating voltage, and for the high-speed operation characteristics, the electronic devices drive and transmit signals at a high voltage level when transmitting the signals.

SUMMARY

In accordance with an embodiment of the present disclosure, a signal transmission circuit may include a first latch driving circuit configured to latch a first alignment signal, based on a first division clock signal and a second division clock signal, and to drive a transmission signal, and a second latch driving circuit configured to latch a second alignment signal, based on the second division clock signal and a first inverted division clock signal, and to drive the transmission signal.

In accordance with an embodiment of the present disclosure, a signal transmission circuit may include a latch signal generation circuit configured to latch an alignment signal, based on a first division clock signal and a second division clock signal, and to generate a latch signal and an inverted latch signal that are driven to a voltage level higher than a voltage level of the alignment signal, a pre-charge signal generation circuit configured to generate a pre-charge signal and an inverted pre-charge signal, based on the latch signal, the inverted latch signal, and the second division clock signal, a pull-down signal generation circuit configured to generate a pull-down drive signal based on the latch signal, a pull-up signal generation circuit configured to generate a pull-up drive signal based on the inverted latch signal, and a drive circuit configured to drive a transmission signal to a voltage level higher than a voltage level of the alignment signal based on the pull-up drive signal and the pull-down drive signal.

In accordance with an embodiment of the present disclosure, a method may comprise latching, based on a first division clock signal and a second division clock signal, a first alignment signal to drive a transmission signal and to generate a latch signal and an inverted latch signal; generating a pre-charge signal based on the latch signal, the inverted latch signal, and the second division clock signal; and driving, in response to the pre-charge signal, the latch signal, the inverted latch signal to perform a pre-charge operation to stop driving the transmission signal.

DETAILED DESCRIPTION

In the following description of embodiments, when a parameter is referred to as being "predetermined," the value of the parameter may be determined in advance when the parameter is used in a process or an algorithm. The value of the parameter may be set when the process or the algorithm starts or may be set during a period in which the process or the algorithm is executed.

Although the terms "first," "second," "third," and so forth are used herein to describe various elements, these elements should not be limited by these terms. These terms are only used to distinguish one element from another element and are not intended to imply an order or number of elements. Thus, a first element in some embodiments may be termed a second element in other embodiments without departing from the teachings of the present disclosure.

When an element is referred to as being "connected" or "coupled" to another element, the element may be directly connected or coupled to the other element or intervening elements may be present. In contrast, when an element is referred to as being "directly connected" or "directly coupled" to another element, no intervening elements are present.

A logic "high" level and a logic "low" level may be used to describe logic levels of electric signals. A signal at a logic "high" level is distinguished from a signal at a logic "low" level. For example, when a signal at first voltage corresponds to a signal at a logic "high" level, a signal at a second voltage corresponds to a signal at a logic "low" level. In an embodiment, the logic "high" level may be set as a voltage level that is higher than a voltage level of the logic "low"

level. Logic levels of signals may be set to be different or opposite according to the embodiments. For example, a certain signal at a logic "high" level in one embodiment may be set to a logic "low" level in another embodiment.

The term "logic bit set" may include a combination of logic levels of bits included in a signal. When the logic level of each of the bits included in the signal is changed, the logic bit set of the signal may be set differently. For example, when the signal includes two bits, when the logic level of each of the two bits included in the signal is "logic low level, logic low level," the logic bit set of the signal may be set as the first logic bit set, and when the logic level of each of the two bits included in the signal is "a logic low level and a logic high level," the logic bit set of the signal may be set as the second logic bit set.

Various embodiments of the present disclosure are described in more detail with reference to the accompanying drawings. The embodiments are described for illustrative purposes only and are not intended to limit the scope of the present disclosure.

For synchronous electronic devices that operate in synchronization with a clock signal, a division clock signal, generated by dividing the frequency of the clock signal, is used for fast signal input and output. The synchronous electronic devices can have improved high-speed operation characteristics by driving and transmitting signals at a high voltage level when inputting and outputting the signals, based on the division clock signal.

Figure 1:
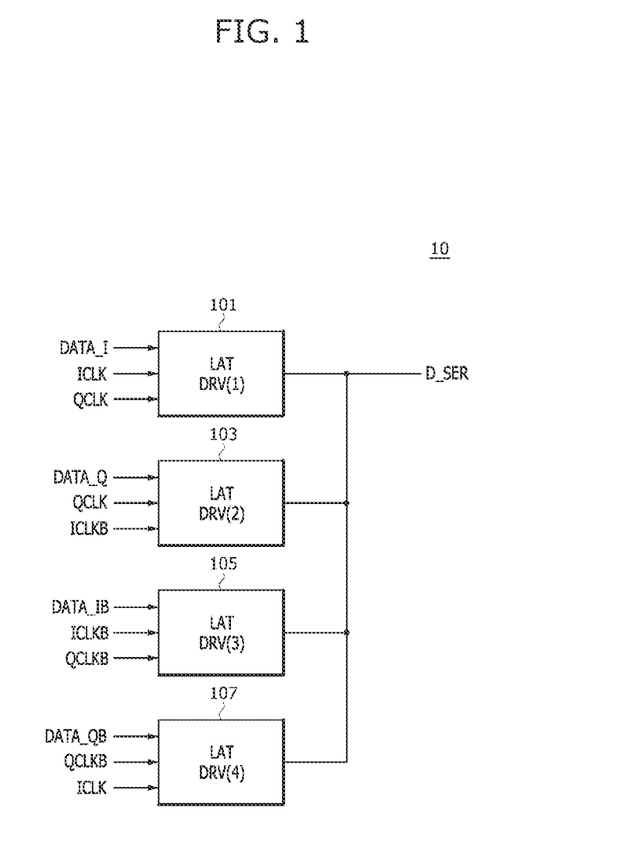
FIG. 1 is a block diagram illustrating a signal transmission circuit according to an embodiment of the present disclosure.

FIG. 1 is a block diagram illustrating a signal transmission circuit 10 according to an embodiment of the present disclosure.

As shown in FIG. 1, the signal transmission circuit 10 includes a first latch driving circuit (LAT DRV(1)) 101, a second latch driving circuit (LAT DRV(2)) 103, a third latch driving circuit (LAT DRV(3)) 105, and a fourth latch driving circuit (LAT DRV(4)) 107.

The first latch driving circuit 101 latches a first alignment signal DATA_I, based on a first division clock signal ICLK and a second division clock signal QCLK, to drive a transmission signal D_SER. Each of the first division clock signal ICLK and the second division clock signal QCLK may be generated by dividing the frequency of a clock signal (not shown) received, for example, from an external source, by an electronic device (not shown) including the signal transmission circuit 10. Each of the first division clock signal ICLK and the second division clock signal QCLK may be generated as a two-division clock signal. The second division clock signal QCLK has a phase that lags the phase of the first division clock signal ICLK by 90°. The present disclosure is not limited to this example. The two-division signal may refer to a signal that has a cycle twice as large as the clock cycle. The first alignment signal DATA_I may include a signal that is aligned and synchronized with the first division clock signal ICLK. The first alignment signal DATA_I is generated by being latched in synchronization with the first division clock signal ICLK, although the present disclosure is not limited to this example.

The first latch driving circuit 101 latches the first alignment signal DATA_I in synchronization with the first division clock signal ICLK and drives the transmission signal D_SER based on the result of latching the first alignment signal DATA_I. In this example, the first latch driving circuit 101 latches the first alignment signal DATA_I at a voltage level higher than the voltage level of the first alignment signal DATA_I and drives the transmission signal D_SER to a voltage level higher than the voltage level of the first alignment signal DATA_I. The first latch driving circuit 101 pre-charges the transmission signal D_SER in synchronization with the second division clock signal QCLK in this example. As described above, the first latch driving circuit 101 drives the transmission signal D_SER in synchronization with the first division clock signal ICLK and pre-charges the transmission signal D_SER in synchronization with the second division clock signal QCLK. Accordingly, the first latch driving circuit 101 drives the transmission signal D_SER that is during a unit section depending on the first division clock signal ICLK and the second division clock signal QCLK. In this example, the unit section may be set to ¼ cycle of each of the first division clock signal ICLK and the second division clock signal QCLK or ½ cycle of each of the clock signals, although the present disclosure is not limited to this example.

The second latch driving circuit 103 latches a second alignment signal DATA_Q, based on the second division clock signal QCLK and a first inverted division clock signal ICLKB, to drive the transmission signal D_SER. The first inverted division clock signal ICLKB is generated by inverting the first division clock signal ICLK. The second alignment signal DATA_Q may be a signal that is aligned and synchronized with the second division clock signal QCLK. The second alignment signal DATA_Q is generated by being latched in synchronization with the second division clock signal QCLK, although the present disclosure is not limited to this example. The second latch driving circuit 103 latches the second alignment signal DATA_Q in synchronization with the second division clock signal QCLK and drives the transmission signal D_SER based on the result of latching the second alignment signal DATA_Q. In this example, the second latch driving circuit 103 latches the second alignment signal DATA_Q at a voltage level higher than the voltage level of the second alignment signal DATA_Q and drives the transmission signal D_SER to a voltage level higher than the voltage level of the second alignment signal DATA_Q. The second latch driving circuit 103 pre-charges the transmission signal D_SER in synchronization with the first inverted division clock signal ICLKB in this example. As described above, the second latch driving circuit 103 drives the transmission signal D_SER in synchronization with the second division clock signal QCLK and pre-charges the transmission signal D_SER in synchronization with the first inverted division clock signal ICLKB. Accordingly, the second latch driving circuit 103 drives the transmission signal D_SER that is during a unit section depending on the second division clock signal QCLK and the first inverted division clock signal ICLKB.

The third latch driving circuit 105 latches a third alignment signal DATA_IB, based on the first inverted division clock signal ICLKB and a second inverted division clock signal QCLKB, to drive the transmission signal D_SER. The second inverted division clock signal QCLKB is generated by inverting the second division clock signal QCLK. The third alignment signal DATA_IB may be a signal that is aligned and synchronized with the first inverted division clock signal ICLKB. The third alignment signal DATA_IB is generated by being latched in synchronization with the first inverted division clock signal ICLKB, although the present disclosure is not limited to this example. The third latch driving circuit 105 latches the third alignment signal DATA_IB in synchronization with the first inverted division clock signal ICLKB and drives the transmission signal D_SER, based on the result of latching the third alignment signal DATA_IB. In this example, the third latch driving circuit 105 latches the third alignment signal DATA_IB at a voltage level higher than the voltage level of the third alignment signal DATA_IB and drives the transmission signal D_SER to a voltage level higher than the voltage level of the third alignment signal DATA_IB. The third latch driving circuit 105 pre-charges the transmission signal D_SER in synchronization with the second inverted division clock signal QCLKB in this example. As described above, the third latch driving circuit 105 drives the transmission signal D_SER in synchronization with the first inverted division clock signal ICLKB and pre-charges the transmission signal D_SER in synchronization with the second inverted division clock signal QCLKB. Accordingly, the third latch driving circuit 105 drives the transmission signal D_SER that is during a unit section depending on the first inverted division clock signal ICLKB and the second inverted division clock signal QCLKB.

The fourth latch driving circuit 107 latches a fourth alignment signal DATA_QB, based on the second inverted division clock signal QCLKB and the first division clock signal ICLK, to drive the transmission signal D_SER. The fourth alignment signal DATA_QB is generated by being latched in synchronization with the second inverted division clock signal QCLKB, although the present disclosure is not limited to this example. The fourth latch driving circuit 107 latches the fourth alignment signal DATA_QB in synchronization with the second inverted division clock signal QCLKB and drives the transmission signal D_SER based on a result of latching the fourth alignment signal DATA_QB. In this example, the fourth latch driving circuit 107 latches the fourth alignment signal DATA_QB at a voltage level higher than the voltage level of the fourth alignment signal DATA_QB and drives the transmission signal D_SER to a voltage level higher than the voltage level of the fourth alignment signal DATA_QB. The fourth latch driving circuit 107 pre-charges the transmission signal D_SER in synchronization with the first division clock signal ICLK in this example. As described above, the fourth latch driving circuit 107 drives the transmission signal D_SER in synchronization with the second inverted division clock signal QCLKB and pre-charges the transmission signal D_SER in synchronization with the first division clock signal ICLK. Accordingly, the fourth latch driving circuit 107 drives the transmission signal D_SER that is during a unit section depending on the second inverted division clock signal QCLKB and the first division clock signal ICLK.

Figure 2:
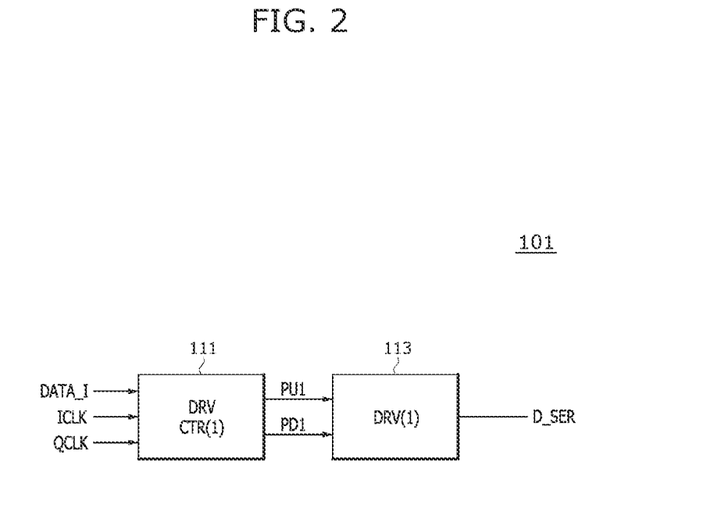
FIG. 2 is a block diagram illustrating an embodiment of a first latch driving circuit of the signal transmission circuit shown in FIG. 1.

FIG. 2 is a block diagram illustrating an embodiment of the first latch driving circuit 101 shown in FIG. 1.

As shown in FIG. 2, the first latch driving circuit 101 includes a first drive control circuit (DRV CTR(1)) 111 and a first drive circuit (DRV(1)) 113.

The first drive control circuit 111 generates a first pull-up drive signal PU1 and a first pull-down drive signal PD1 based on the first division clock signal ICLK, the second division clock signal QCLK, and the first alignment signal DATA_I. The first drive control circuit 111 latches the first alignment signal DATA_I in synchronization with the first division clock signal ICLK to generate the first pull-up drive signal PU1 and the first pull-down drive signal PD1. The first drive control circuit 111 generates the first pull-up drive signal PU1 and the first pull-down drive signal PD1 that are selectively activated depending on the logic level of the first alignment signal DATA_I. As an example, the first drive control circuit 111 generates the first pull-up drive signal PU1 that is activated and the first pull-down drive signal PD1 that is deactivated when the first alignment signal DATA_I is at a logic "high" level in synchronization with the first division clock signal ICLK. As another example, the first drive control circuit 111 generates the first pull-up drive signal PU1 that is deactivated and the first pull-down drive signal PD1 that is activated when the first alignment signal DATA_I is at a logic "low" level in synchronization with the first division clock signal ICLK.

The first drive circuit 113 is electrically connected to the first drive control circuit 111 and receives the first pull-up drive signal PU1 and the first pull-down drive signal PD1 from the first drive control circuit 111. The first drive circuit 113 drives the transmission signal D_SER based on or in response to the first pull-up drive signal PU1 and the first pull-down drive signal PD1. The first drive circuit 113 controls driving of the transmission signal D_SER depending on which of the first pull-up drive signal PU1 and the first pull-down drive signal PD1 is activated. As an example, when the first alignment signal DATA_I is at a logic "high" level and the activated first pull-up drive signal PU1 and the deactivated first pull-down drive signal PD1 are generated, the first drive circuit 113 drives the transmission signal D_SER to a voltage level (e.g., power supply voltage VDD) higher than the voltage level of the first alignment signal DATA_I. As another example, when the first alignment signal DATA_I is at a logic "low" level and the deactivated first pull-up drive signal PU1 and the activated first pull-down drive signal PD1 are generated, the first drive circuit 113 may drive the transmission signal D_SER to a ground voltage.

Figure 3:
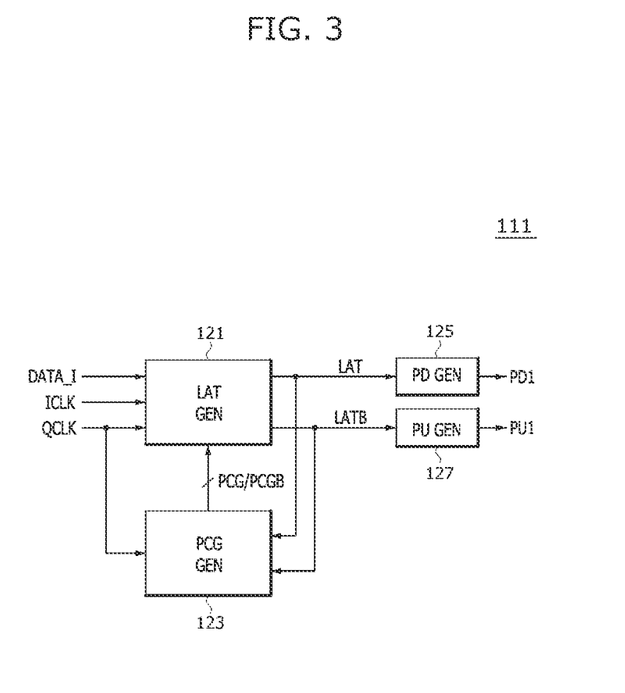
FIG. 3 is a block diagram illustrating an embodiment of a first drive control circuit of the first latch driving circuit shown in FIG. 2.

FIG. 3 is a block diagram illustrating an embodiment of the first drive control circuit 111 shown in FIG. 2.

As shown in FIG. 3, the first drive control circuit 111 includes a latch signal generation circuit (LAT GEN) 121, a pre-charge signal generation circuit (PCG GEN) 123, a pull-down signal generation circuit (PD GEN) 125, and a pull-up signal generation circuit (PU GEN) 127.

The latch signal generation circuit 121 latches the first alignment signal DATA_I, based on the first division clock signal ICLK and the second division clock signal QCLK, and generates a latch signal LAT and an inverted latch signal LATB. As an example, the latch signal generation circuit 121 generates the latch signal LAT that is driven to a voltage level higher than the voltage level of the first alignment signal DATA_I and the inverted latch signal LATB that is driven to a ground voltage when the first alignment signal DATA_I of a logic "high" level is latched based on the first division clock signal ICLK and the second division clock signal QCLK. As another example, the latch signal generation circuit 121 generates the latch signal LAT that is driven to the ground voltage and the inverted latch signal LATB that is driven to the voltage level higher than the voltage level of the first alignment signal DATA_I when the first alignment signal DATA_I of a logic "low" level is latched based on the first division clock signal ICLK and the second division clock signal QCLK. The voltage level of each of the latch signal LAT and the inverted latch signal LATB, generated depending on the first alignment signal DATA_I latched in the latch signal generation circuit 121, may be set differently depending on the embodiment.

The pre-charge signal generation circuit 123 is electrically connected to the latch signal generation circuit 121 and receives the latch signal LAT and the inverted latch signal LATB from the latch signal generation circuit 121. The pre-charge signal generation circuit 123 generates a pre-charge signal PCG and an inverted pre-charge signal PCGB, based on the second division clock signal QCLK, the latch signal LAT, and the inverted latch signal LATB. The pre-charge signal generation circuit 123 generates the pre-charge signal PCG and the inverted pre-charge signal PCGB that are both activated for a pre-charge operation in synchronization with the second division clock signal QCLK in a state in which the latch signal LAT has an inverted logic level with respect to the logic level of the inverted latch signal LATB. The state in which the latch signal LAT and the inverted latch signal LATB have inverted logic levels may indicate a state in which the latch signal generation circuit 121 latches the first alignment signal DATA_I in synchronization with the first division clock signal ICLK. In addition, the pre-charge signal PCG and the inverted pre-charge signal PCGB are activated at inverted logic levels with respect to each other, in other words, the logic level of the pre-charge signal PCG is inverted with respect to the logic level of the inverted pre-charge signal PCGB, and the logic levels at which the pre-charge signal PCG and the inverted pre-charge signal PCGB are activated may be set in various ways depending on the embodiment.

The pull-down signal generation circuit 125 is electrically connected to the latch signal generation circuit 121 to receive the latch signal LAT from the latch signal generation circuit 121. The pull-down signal generation circuit 125 generates the first pull-down drive signal PD1 based on the latch signal LAT. The pull-down signal generation circuit 125 may be implemented to inversely buffer the latch signal LAT to generate the first pull-down drive signal PD1, although the present disclosure is not limited to this example. As an example, the pull-down signal generation circuit 125 generates the first pull-down drive signal PD1 that is activated at a logic "high" level when the latch signal LAT is generated at a logic "low" level when the first alignment signal DATA_I is at a logic "low" level.

The pull-up signal generation circuit 127 is electrically connected to the latch signal generation circuit 121 and receives the inverted latch signal LATB from the latch signal generation circuit 121. The pull-up signal generation circuit 127 generates the first pull-up drive signal PU1 based on the inverted latch signal LATB. The pull-up signal generation circuit 127 buffers the inverted latch signal LATB to generate the first pull-up drive signal PU1, although the present disclosure is not limited to this example. As an example, the pull-up signal generation circuit 127 generates the first pull-up drive signal PU1 that is activated at a logic "low" level when the inverted latch signal LATB is generated at a logic "low" level when the first alignment signal DATA_I is at a logic "high" level.

Figure 4:
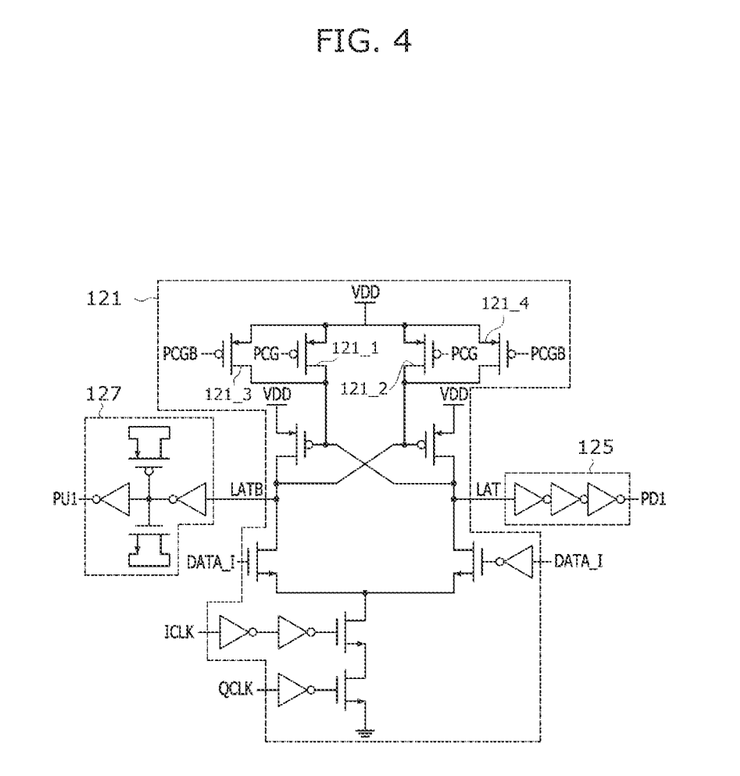
FIG. 4 is a circuit diagram illustrating an embodiment of a latch signal generation circuit, a pull-down signal generation circuit, and a pull-up signal generation circuit shown in FIG. 3.

FIG. 4 is a circuit diagram illustrating an embodiment of the latch signal generation circuit 121, the pull-down signal generation circuit 125, and the pull-up signal generation circuit 127 shown in FIG. 3.

The latch signal generation circuit 121 latches the first alignment signal DATA_I, based on the first division clock signal ICLK and the second division clock signal QCLK, and generates the latch signal LAT and the inverted latch signal LATB. As an example, the latch signal generation circuit 121 latches the first alignment signal DATA_I at a logic "high" level to generate the latch signal LAT that is driven to the power supply voltage VDD and the inverted latch signal LATB that is driven to the ground voltage in synchronization when the first division clock signal ICLK transitions from a logic "low" level to a logic "high" level (hereinafter, referred to as a "rising edge") when the second division clock signal QCLK is at a logic "low" level. As another example, the latch signal generation circuit 121 latches the first alignment signal DATA_I at a logic "low" level to generate the latch signal LAT that is driven to the ground voltage and the inverted latch signal LATB that is driven to the power supply voltage VDD in synchronization with the rising edge of the first division clock signal ICLK when the second division clock signal QCLK is at a logic "low" level. The latch signal generation circuit 121 includes PMOS transistors 121_1 and 121_2 that are turned on based on the pre-charge signal PCG and PMOS transistors 121_3 and 121_4 that are turned on based on the inverted pre-charge signal PCGB. The PMOS transistors 121_1 and 121_2 are turned on when the pre-charge operation is not performed to drive the latch signal LAT and the inverted latch signal LATB to the power supply voltage VDD. The PMOS transistors 121_3 and 121_4 drive the latch signal LAT and the inverted latch signal LATB to the power supply voltage VDD during the pre-charge operation. The PMOS transistors 121_1 and 121_2 may be implemented to have weaker driving force than the PMOS transistors 121_3 and 121_4 in order for the latch signal generation circuit 121 to latch the first alignment signal DATA_I, based on the first division clock signal ICLK and the second division clock signal QCLK, to drive the latch signal LAT and the inverted latch signal LATB to different voltage levels when the pre-charge operation is not performed.

The pull-down signal generation circuit 125 inversely buffers the latch signal LAT to generate the first pull-down drive signal PD1. The pull-down signal generation circuit 125 generates the first pull-down drive signal PD1 that is activated at a logic "high" level when the latch signal LAT is generated at a logic "low" level when the first alignment signal DATA_I is at a logic "low" level.

The pull-up signal generation circuit 127 buffers the inverted latch signal LATB to generate the first pull-up drive signal PU1. The pull-up signal generation circuit 127 generates the first pull-up drive signal PU1 that is activated at a logic "low" level when the inverted latch signal LATB is generated at a logic "low" level when the first alignment signal DATA_I is at a logic "high" level.

Figure 5:
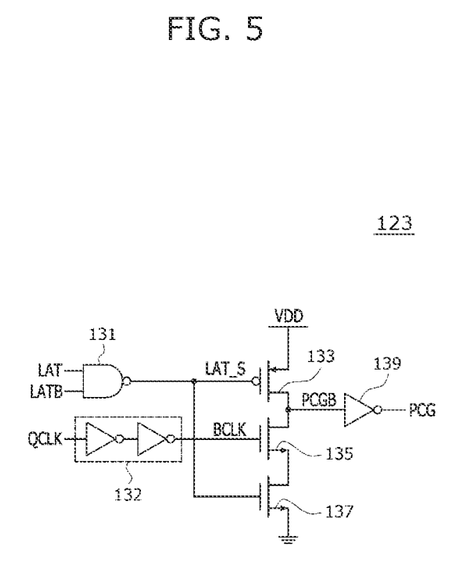
FIG. 5 is a circuit diagram according to an embodiment of a pre-charge signal generation circuit shown in FIG. 3.

FIG. 5 is a circuit diagram-according to an embodiment of the pre-charge signal generation circuit 123 shown in FIG. 3.

As shown in FIG. 5, the pre-charge signal generation circuit 123 includes a NAND gate 131, a clock signal buffer circuit 132, a PMOS transistor 133, NMOS transistors 135 and 137, and an inverter 139. The NAND gate 131 receives the latch signal LAT and the inverted latch signal LATB and performs a logical NAND operation to generate a synthetic latch signal LAT_S. The NAND gate 131 generates the synthetic latch signal LAT_S that is activated at a logic "low" level when both the latch signal LAT and the inverted latch signal LATB are driven to the power supply voltage VDD during the pre-charge operation. The NAND gate 131 generates the synthetic latch signal LAT_S that is deactivated at a logic "high" level in a state in which the latch signal LAT and the inverted latch signal LATB are driven at different voltage levels. The clock signal buffer circuit 132 buffers the second division clock signal QCLK to generate a buffer clock signal BCLK. The PMOS transistor 133 is turned on based on the synthetic latch signal LAT_S. The PMOS transistor 133 is turned on when both the latch signal LAT and the inverted latch signal LATB are driven to the power supply voltage VDD and the synthetic latch signal LAT_S is activated at a logic "low" level to drive the inverted pre-charge signal PCGB to the power supply voltage VDD. The NMOS transistor 135 is turned on based on the buffer clock signal BCLK. The NMOS transistor 135 is turned on in synchronization with the rising edge of the second division clock signal QCLK. The NMOS transistor 137 is turned on based on the synthetic latch signal LAT_S. The NMOS transistor 137 is turned on when the latch signal LAT and the inverted latch signal LATB are driven to different voltage levels and the synthetic latch signal LAT_S is deactivated at a logic "high" level. When the NMOS transistors 135 and 137 are turned on, the inverted pre-charge signal PCGB is driven to the ground voltage. The inverter 139 inversely buffers the inverted pre-charge signal PCGB to generate the pre-charge signal PCG.

The pre-charge signal generation circuit 123 generates the inverted pre-charge signal PCGB that is driven to the ground voltage by the NMOS transistors 135 and 137 that are turned on in synchronization with the rising edge of the second division clock signal QCLK and activated at a logic "low" level in a state in which the logic level of the latch signal LAT is inverted or opposite with respect to the logic level of the inverted latch signal LATB and inversely buffers the inverted pre-charge signal PCGB to generate the pre-charge signal PCG that is activated at a logic "high" level. During the pre-charge operation, the pre-charge signal generation circuit 123 generates the inverted pre-charge signal PCGB that is driven to the power supply voltage VDD by the PMOS transistor 133 turned on by receiving the synthetic latch signal LAT_S that is activated at a logic "low" level when both the latch signal LAT and the inverted latch signal LATB are driven to the power supply voltage VDD and inversely buffers the inverted pre-charge signal PCGB to generate the pre-charge signal PCG that is deactivated at a logic "low" level.

Figure 6:
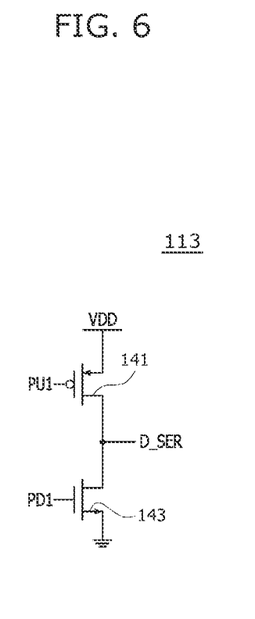
FIG. 6 a block diagram illustrating an embodiment of a first drive circuit of the first latch driving circuit shown in FIG. 2.

FIG. 6 is a block diagram illustrating an embodiment of the first drive circuit 113 shown in FIG. 2.

As shown in FIG. 6, the first drive circuit 113 includes a PMOS transistor 141 and an NMOS transistor 143. The PMOS transistor 141 is turned on based on the first pull-up drive signal PU1. The PMOS transistor 141 receives the first pull-up drive signal PU1 that is activated at a logic "low" level when the inverted latch signal LATB is generated at a logic "low" level when the first alignment signal DATA_I is at a logic "high" level. The PMOS transistor 141 is turned on when the first pull-up drive signal PU1 that is activated at a logic "low" level is received to drive the transmission signal D_SER to the power supply voltage VDD. The NMOS transistor 143 is turned on based on the first pull-down drive signal PD1. The NMOS transistor 143 receives the first pull-down drive signal PD1 that is activated at a logic "high" level when the latch signal LAT is generated at a logic "low" level when the first alignment signal DATA_I is at a logic "low" level. The NMOS transistor 143 is turned on when the first pull-down drive signal PD1 activated at a logic "high" level is received to drive the transmission signal D_SER to the ground voltage.

Figure 7:
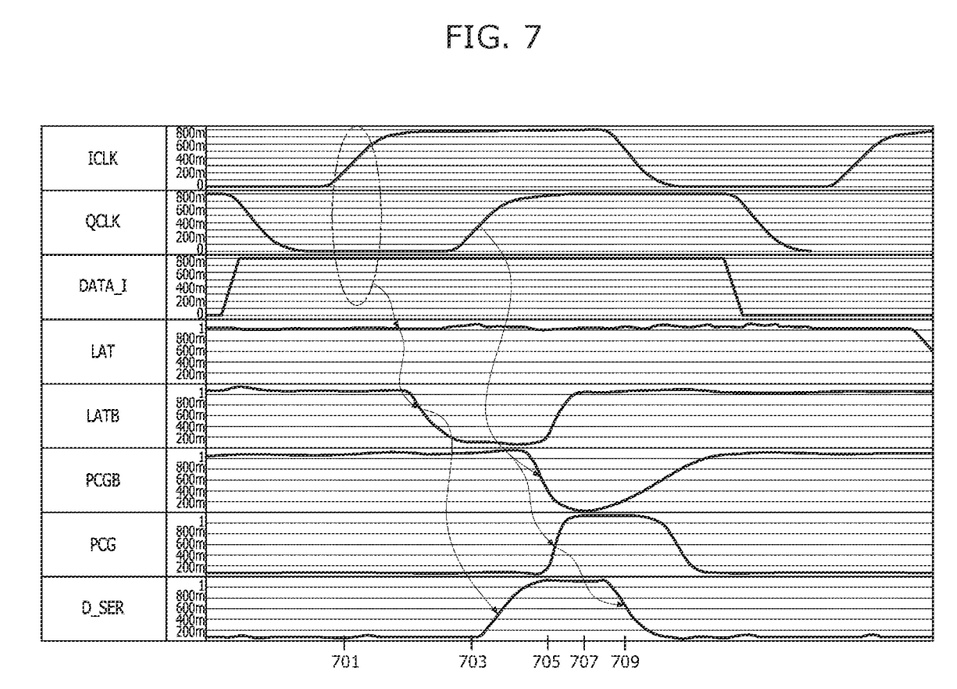
FIG. 7 is a timing diagram illustrating timing of operation of the first latch driving circuit according to an embodiment.

FIG. 7 is a timing diagram illustrating timing of operation of the first latch driving circuit 101 according to the embodiment in FIG. 2.

As shown in FIG. 4 and FIG. 7, the latch signal generation circuit 121 latches the first alignment signal DATA_I at a logic "high" level in synchronization with a rising edge at 701 of the first division clock signal ICLK to generate the latch signal LAT that is driven to the power supply voltage VDD and the inverted latch signal LATB that is driven to the ground voltage. The pull-down signal generation circuit 125 generates the first pull-down drive signal PD1 that is deactivated at a logic "low" level when the latch signal LAT is generated at a logic "high" level and generates the first pull-up drive signal PU1 that is activated at a logic "low" level when the inverted latch signal LATB is generated at a logic "low" level.

As shown in FIG. 6 and FIG. 7, the first drive circuit 113 receives the first pull-down drive signal PD1 that is deactivated at a logic "low" level and the first pull-up drive signal PU1 that is activated at a logic "low" level to drive the transmission signal D_SER to the power supply voltage VDD at 703.

As shown in FIG. 5 and FIG. 7, the pre-charge signal generation circuit 123 generates the inverted pre-charge signal PCGB that is activated at a logic "low" level at 705 and the pre-charge signal PCG that is activated at a logic "high" level in synchronization with a rising edge of the second division signal QCLK in a state in which the latch signal LAT is generated at a logic "high" level and the inverted latch signal LATB is generated at a logic "low" level.

As shown in FIG. 4 and FIG. 7, the latch signal generation circuit 121 drives both the latch signal LAT and the inverted latch signal LATB to the power supply voltage VDD for the pre-charge operation when the inverted pre-charge signal PCGB that is activated at a logic "low" level and the pre-charge signal PCG that is activated at a logic "high" level are received at 707. The latch signal generation circuit 121 generates the first pull-down drive signal PD1 that is driven to a logic "low" level when the latch signal LAT is driven to the power supply voltage VDD and generates the first pull-up drive signal PU1 that is driven to a logic "low" level when the inverted latch signal LATB is driven to the power supply voltage VDD.

As shown in FIG. 6 and FIG. 7, the first drive circuit 113 receives the first pull-down drive signal PD1 that is deactivated at a logic "low" level and the first pull-up drive signal PU1 that is deactivated at a logic "high" level to perform the pre-charge operation to stop driving the transmission signal D_SER at 709.

As described above, the first latch driving circuit 101 latches the first alignment signal DATA_I aligned in synchronization with the first division clock signal ICLK at the power supply voltage VDD and drives and transmit the first alignment signal DATA_I as the serial transmission signal D_SER, thereby improving high-speed operation characteristics. In addition, the first latch driving circuit 101 may latch the first alignment signal DATA_I (at the power supply voltage VDD) at a voltage level higher than the voltage level of the first alignment signal DATA_I and may drive the transmission signal D_SER to the power supply voltage VDD. Accordingly, when latching the first alignment signal DATA_I at 0V~800 mV to generate the transmission signal D_SER at 0V~1.2V, a separate level shifter is not needed, thereby reducing the layout area.

Figure 8:
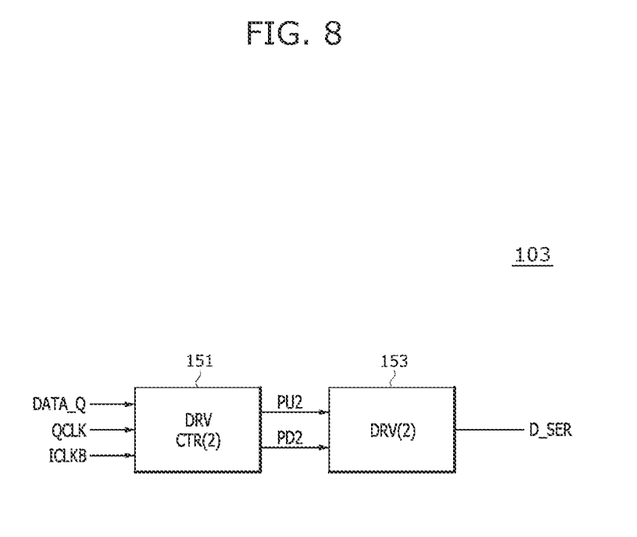
FIG. 8 is a block diagram illustrating an embodiment of a second latch driving circuit of in the signal transmission circuit shown in FIG. 1.

FIG. 8 is a block diagram illustrating an embodiment of the second latch driving circuit 103 shown in FIG. 1.

As shown in FIG. 8, the second latch driving circuit 103 includes a second drive control circuit (DRV CTR(2)) 151 and a second drive circuit (DRV(2)) 153.

The second drive control circuit 151 generates a second pull-up drive signal PU2 and a second pull-down drive signal PD2, based on the second division clock signal QCLK, the first inverted division clock signal ICLKB, and the second alignment signal DATA_Q. The second drive control circuit 151 latches the second alignment signal DATA_Q in synchronization with the second division clock signal QCLK to generate the second pull-up drive signal PU2 and the second pull-down drive signal PD2. The second drive control circuit 151 generates the second pull-up drive signal PU2 and the second pull-down drive signal PD2 that are selectively activated depending on the logic level of the second alignment signal DATA_Q. As an example, the second drive control circuit 151 generates the second pull-up drive signal PU2 that is activated and the second pull-down drive signal PD2 that is deactivated when the second alignment signal DATA_Q is at a logic "high" level in synchronization with the second division clock signal QCLK. As another example, the second drive control circuit 151 generates the second pull-up drive signal PU2 that is deactivated and the second pull-down drive signal PD2 that is activated when the second alignment signal DATA_Q is at a logic "low" level in synchronization with the second division clock signal QCLK.

The second drive circuit 153 is electrically connected to the second drive control circuit 151 and receives the second pull-up drive signal PU2 and the second pull-down drive signal PD2 from the second drive control circuit 151. The second drive circuit 153 drives the transmission signal D_SER based on the second pull-up drive signal PU2 and the second pull-down drive signal PD2. The second drive circuit 153 controls driving of the transmission signal D_SER depending on which of the second pull-up drive signal PU2 and the second pull-down drive signal PD2 is activated. As an example, when the second alignment signal DATA_Q is at a logic "high" level and the activated second pull-up drive signal PU2 and the deactivated second pull-down drive signal PD2 are generated, the second drive circuit 153 drives the transmission signal D_SER to the power supply voltage VDD. As another example, when the second alignment signal DATA_Q is at a logic "low" level and the deactivated second pull-up drive signal PU2 and the activated second pull-down drive signal PD2 are generated, the second drive circuit 153 drives the transmission signal D_SER to the ground voltage.

As describe above, the second latch driving circuit 103A latches the second alignment signal DATA_Q aligned in synchronization with the second division clock signal QCLK at the power supply voltage VDD and drives and transmits the second alignment signal DATA_Q as the serial transmission signal D_SER, thereby improving high-speed operation characteristics. In addition, the second latch driving circuit 103A may latch the second alignment signal DATA_Q (at the power supply voltage VDD) at a voltage level higher than the voltage level of the second alignment signal DATA_Q and may drive the transmission signal D_SER to the power supply voltage VDD. Accordingly, when latching the second alignment signal DATA_Q to generate the transmission signal D_SER, a separate level shifter is not needed, thereby reducing the layout area.

Figure 9:
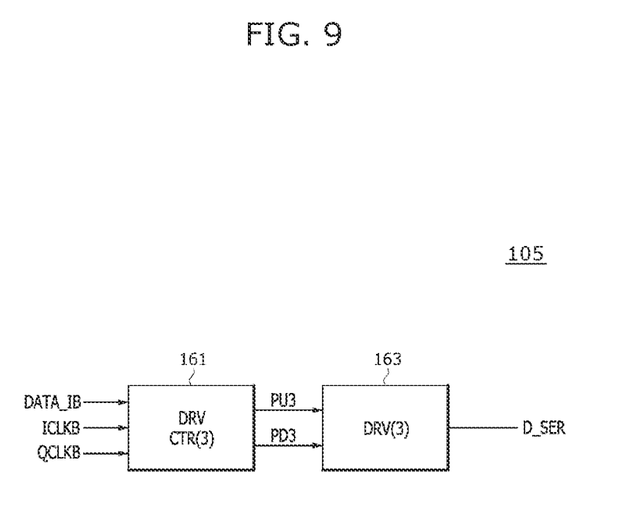
FIG. 9 is a block diagram illustrating an embodiment of a third latch driving circuit of the signal transmission circuit shown in FIG. 1.

FIG. 9 is a block diagram illustrating an embodiment of the third latch driving circuit 105 shown in FIG. 1.

As shown in FIG. 9, the third latch driving circuit 105 includes a third drive control circuit (DRV CTR(3)) 161 and a third drive circuit (DRV(3)) 163.

The third drive control circuit 161 generates a third pull-up drive signal PU3 and a third pull-down drive signal PD3 based on the first inverted division signal clock ICLKB, the second inverted division clock signal QCLKB, and the third alignment signal DATA_IB. The third drive control circuit 161 latches the third alignment signal DATA_IB in synchronization with the first inverted division clock signal ICLKB to generate the third pull-up drive signal PU3 and the third pull-down drive signal PD3. The third drive control circuit 161 generates the third pull-up drive signal PU3 and the third pull-down drive signal PD3 that are selectively activated depending on the logic level of the third alignment signal DATA_IB. As an example, the third drive control circuit 161 generates the third pull-up drive signal PU3 that is activated and the third pull-down drive signal PD3 that is deactivated when the third alignment signal DATA_IB is at a logic "high" level in synchronization with the first inverted division clock signal ICLKB. As another example, the third drive control circuit 161 generates the third pull-up drive signal PU3 that is deactivated and the third pull-down drive signal PD3 that is activated when the third alignment signal DATA_IB is at a logic "low" level in synchronization with the first inverted division clock signal ICLKB.

The third drive circuit 163 is electrically connected to the third drive control circuit 161 and receives the third pull-up drive signal PU3 and the third pull-down drive signal PD3 from the third drive control circuit 161. The third drive circuit 163 drives the transmission signal D_SER based on the third pull-up drive signal PU3 and the third pull-down drive signal PD3. The third drive circuit 163 controls driving of the transmission signal D_SER depending on which of the third pull-up drive signal PU3 and the third pull-down drive signal PD3 is activated. As an example, when the third alignment signal DATA_IB is at a logic "high" level and the activated third pull-up drive signal PU3 and the deactivated third pull-down drive signal PD3 are generated, the third drive circuit 163 drives the transmission signal D_SER to the power supply voltage VDD. As another example, when the third alignment signal DATA_IB is at a logic "low" level and the deactivated third pull-up drive signal PU3 and the activated third pull-down drive signal PD3 are generated, the third drive circuit 163 drives the transmission signal D_SER to the ground voltage.

As described above, the third latch driving circuit 105A latches the third alignment signal DATA_IB that is aligned in synchronization with the first inverted division clock signal ICLKB at the power supply voltage VDD and drives and transmits the latched third alignment signal DATA_IB as the serial transmission signal D_SER, thereby improving high-speed operation characteristics. In addition, the third latch driving circuit 105A may latch the third alignment signal DATA_IB (at the power supply voltage VDD) at a voltage level higher than the voltage level of the third alignment signal DATA_IB and may drive the transmission signal D_SER to the power supply voltage VDD. Accordingly, when latching the third alignment signal DATA_IB to generate the transmission signal D_SER, a separate level shifter is not needed, thereby reducing the layout area.

Figure 10:
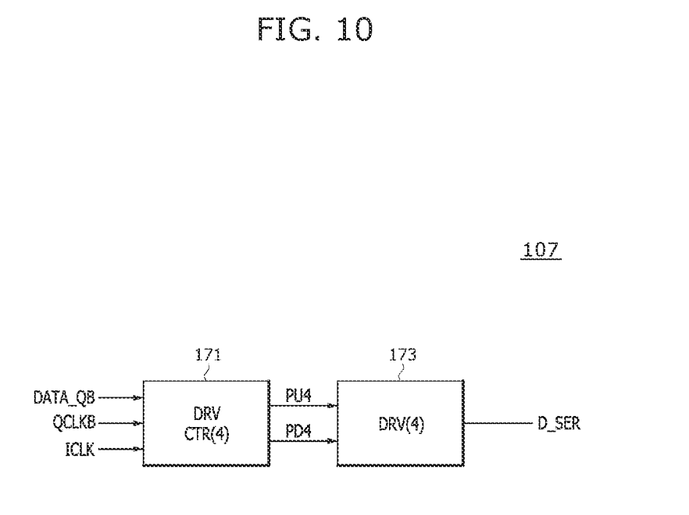
FIG. 10 is a block diagram illustrating an embodiment of a fourth latch driving circuit of the signal transmission circuit shown in FIG. 1.

FIG. 10 is a block diagram illustrating an embodiment of the fourth latch driving circuit 107 shown in FIG. 1.

As shown in FIG. 10, the fourth latch driving circuit 107 includes a fourth drive control circuit (DRV CTR(4)) 171 and a fourth drive circuit (DRV(4)) 173.

The fourth drive control circuit 171 generates a fourth pull-up drive signal PU4 and a fourth pull-down drive signal PD4 based on the second inverted division clock signal QCLKB, the first division clock signal ICLK, and a fourth alignment signal DATA_QB. The fourth drive control circuit 171 latches the fourth alignment signal DATA_QB in synchronization with the second inverted division clock signal QCLKB to generate the fourth pull-up drive signal PU4 and the fourth pull-down drive signal PD4. The fourth drive control circuit 171 generates the fourth pull-up drive signal PU4 and the fourth pull-down drive signal PD4 that are selectively activated depending on the logic level of the fourth alignment signal DATA_QB. As an example, the fourth drive control circuit 171 generates the fourth pull-up drive signal PU4 that is activated and the fourth pull-down drive signal PD4 that is deactivated when the fourth alignment signal DATA_QB is at a logic "high" level in synchronization with the second inverted division clock signal QCLKB. As another example, the fourth drive control circuit 171 generates the fourth pull-up drive signal PU4 that is deactivated and the fourth pull-down drive signal PD4 that is activated when the fourth alignment signal DATA_QB is at a logic "low" level in synchronization with the second inverted division clock signal QCLKB.

The fourth drive circuit 173 is electrically connected to the fourth drive control circuit 171 and receives the fourth pull-up drive signal PU4 and the fourth pull-down drive signal PD4 from the fourth drive control circuit 171. The fourth drive circuit 173 drives the transmission signal D_SER based on the fourth pull-up drive signal PU4 and the fourth pull-down drive signal PD4. The fourth drive circuit 173 controls driving of the transmission signal D_SER depending on which of the fourth pull-up drive signal PU4 and the fourth pull-down drive signal PD4 is activated. As an example, the fourth drive circuit 173 drives the transmission signal D_SER to the power supply voltage VDD when the fourth alignment signal DATA_QB is at a logic "high" level and the activated fourth pull-up drive signal PU4 and the deactivated pull-down drive signal PD4 are generated. As another example, the fourth drive circuit 173 drives the transmission signal D_SER to the ground voltage when the fourth alignment signal DATA_QB is at a logic "low" level and the deactivated fourth pull-up drive signal PU4 and the activated pull-down drive signal PD4 are generated.

As described above, the fourth latch driving circuit 107 latches the fourth alignment signal DATA_QB aligned in synchronization with the second inverted division clock signal QCLKB at the power supply voltage VDD and drives and transmits the latched fourth alignment signal DATA_QB as the serial transmission signal D_SER, thereby improving high-speed operation characteristics. In addition, the fourth latch driving circuit 107 may latch the fourth alignment signal DATA_QB (at the power supply voltage VDD) at a voltage level higher than the voltage level of the fourth alignment signal DATA_QB and may drive the transmission signal D_SER to the power supply voltage VDD. Accordingly, when latching the fourth alignment signal DATA_QB to generate the transmission signal D_SER, a separate level shifter is not needed, thereby reducing the layout area.

Concepts are disclosed in conjunction with various embodiments as described above. Those skilled in the art will understand that various modifications, additions, and substitutions are possible, without departing from the scope and spirit of the present disclosure. Accordingly, the embodiments disclosed in the present specification should not be considered from a restrictive standpoint but rather from an illustrative standpoint. The scope of the present disclosure is not limited to the above descriptions, and all of distinctive features within an equivalent scope should be construed as being included in the present disclosure.

What is claimed is:

1. A signal transmission circuit comprising:
    a first latch driving circuit configured to latch a first alignment signal, based on a first division clock signal and a second division clock signal, and to drive a transmission signal; and
    a second latch driving circuit configured to latch a second alignment signal, based on the second division clock signal and a first inverted division clock signal, and to drive the transmission signal,
    wherein the first latch driving circuit comprises a drive control circuit, wherein the drive control circuit comprises a latch signal generation circuit configured to latch the first alignment signal, based on the first division clock signal and the second division clock signal, and to generate a latch signal and an inverted latch signal, a pre-charge signal generation circuit configured to generate a pre-charge signal and an inverted pre-charge signal, based on the latch signal, the inverted latch signal, and the second division clock signal, a pull-down signal generation circuit configured to generate a first pull-down drive signal based on the latch signal, a pull-up signal generation circuit configured to generate a first pull-up drive signal based on the inverted latch signal, and wherein the first latch driving circuit further comprises a drive circuit configured to drive the transmission signal based on the first pull-up drive signal and the first pull-down drive signal.

2. The signal transmission circuit of claim 1, wherein the first latch driving circuit is configured to receive the second division clock signal having a phase that lags a phase of the first division clock signal by 90°.

3. The signal transmission circuit of claim 1, wherein the first latch driving circuit is configured to receive the first alignment signal that is aligned in synchronization with the first division clock signal.

4. The signal transmission circuit of claim 1, wherein the first latch driving circuit is configured to latch the first alignment signal in synchronization with the first division clock signal and drive the transmission signal based on a result of latching the first alignment signal.

5. The signal transmission circuit of claim 1, wherein the first latch driving circuit is configured to pre-charge the transmission signal in synchronization with the second division clock signal.

6. The signal transmission circuit of claim 1, wherein the first latch driving circuit is configured to latch the first alignment signal at a voltage level higher than a voltage level of the first alignment signal in synchronization with the first division clock signal, and to drive the transmission signal to a voltage level higher than the voltage level of the first alignment signal, based on a result of latching the first alignment signal.

7. The signal transmission circuit of claim 1, wherein the drive control circuit is configured to generate the first pull-up drive signal and the first pull-down drive signal that are selectively activated depending on a logic level of the first alignment signal.

8. The signal transmission circuit of claim 1, wherein the drive circuit is configured to:
    drive the transmission signal to a power supply voltage depending on the first pull-up drive signal that is activated when the first alignment signal is at a first logic level, and
    drive the transmission signal to a ground voltage depending on the first pull-down drive signal that is activated when the first alignment signal is at a second logic level.

9. The signal transmission circuit of claim 1, wherein the latch signal generation circuit is configured to generate the latch signal and the inverted latch signal with logic levels depending on the first alignment signal in synchronization with the first division clock signal.

10. The signal transmission circuit of claim 1, wherein the pre-charge signal generation circuit is configured to generate the pre-charge signal and the inverted pre-charge signal that are both activated for a pre-charge operation in synchronization with the second division clock signal in a state in which a logic level of the latch signal is inverted with respect to a logic level of the inverted latch signal.

11. The signal transmission circuit of claim 1, wherein the second latch driving circuit is configured to receive the first inverted division clock signal that is generated by inverting the first division clock signal.

12. The signal transmission circuit of claim 1, wherein the second latch driving circuit is configured to receive the second alignment signal that is aligned in synchronization with the second division clock signal.

13. The signal transmission circuit of claim 1, wherein the second latch driving circuit is configured to:
- latch the second alignment signal in synchronization with the second division clock signal and drive the transmission signal based on a result of latching the second alignment signal, and
- pre-charge the transmission signal in synchronization with the first inverted division clock signal.

14. The signal transmission circuit of claim 1, wherein the second latch driving circuit is configured to latch the second alignment signal at a voltage level higher than a voltage level of the second alignment signal in synchronization with the second division clock signal, and to drive the transmission signal to the voltage level higher than the voltage level of the second alignment signal, based on a result of latching the second alignment signal.

15. The signal transmission circuit of claim 1, wherein the second latch driving circuit comprises:
- a drive control circuit configured to latch the second alignment signal in synchronization with the second division clock signal to generate a second pull-up drive signal and a second pull-down drive signal; and
- a drive circuit configured to drive the transmission signal, based on the second pull-up drive signal and the second pull-down drive signal.

\* \* \* \* \*